(12) United States Patent
Lu

(10) Patent No.: US 10,355,638 B2
(45) Date of Patent: Jul. 16, 2019

(54) SOLAR JUNCTION BOX

(71) Applicant: LEONI CABLE (CHINA) CO., LTD., Changzhou (CN)

(72) Inventor: Wei Lu, Changzhou (CN)

(73) Assignee: LEONI CABLE (CHINA) CO., LTD., Changzhou (CN)

( * ) Notice: Subject to any disclaimer, the term of this patent is extended or adjusted under 35 U.S.C. 154(b) by 0 days.

(21) Appl. No.: 16/068,661

(22) PCT Filed: Jan. 6, 2016

(86) PCT No.: PCT/CN2016/070244
§ 371 (c)(1),
(2) Date: Aug. 6, 2018

(87) PCT Pub. No.: WO2017/117737
PCT Pub. Date: Jul. 13, 2017

(65) Prior Publication Data
US 2019/0028058 A1    Jan. 24, 2019

(51) Int. Cl.
| | |
|---|---|
| *H02S 40/34* | (2014.01) |
| *H02G 3/08* | (2006.01) |
| *H02G 3/14* | (2006.01) |
| *H01R 4/18* | (2006.01) |
| *H02G 3/03* | (2006.01) |
| *H01R 25/16* | (2006.01) |
| *H02G 3/16* | (2006.01) |

(52) U.S. Cl.
CPC .......... *H02S 40/345* (2014.12); *H01R 4/184* (2013.01); *H01R 25/162* (2013.01); *H02G 3/03* (2013.01); *H02G 3/083* (2013.01); *H02G 3/088* (2013.01); *H02G 3/14* (2013.01); *H02G 3/16* (2013.01)

(58) Field of Classification Search
CPC ........ H02S 40/345; H02G 3/16; H02G 3/083; H02G 3/14; H02G 3/03; H02G 3/088; H01R 25/162; H01R 4/184
USPC ........................................... 174/522
See application file for complete search history.

(56) References Cited

U.S. PATENT DOCUMENTS

| | | | |
|---|---|---|---|
| 9,706,660 B1 * | 7/2017 | Mostoller | ............... H02S 40/34 |
| 2008/0110490 A1 * | 5/2008 | Duesterhoeft | .......... H02S 40/34 |
| | | | 136/248 |
| 2010/0218802 A1 * | 9/2010 | Quiter | .................. H01R 4/4827 |
| | | | 136/244 |

(Continued)

FOREIGN PATENT DOCUMENTS

| | | |
|---|---|---|
| CN | 201541100 U | 8/2010 |
| CN | 202004001 U | 10/2011 |

(Continued)

*Primary Examiner* — Sherman Ng
(74) *Attorney, Agent, or Firm* — Goklap Bayramoglu

(57) ABSTRACT

A solar junction box includes a box cover and a terminal plate. The terminal plate includes a plurality of terminals arranged side by side and diode units for connecting adjacent terminals, and the terminals and diode units are integrally packaged in plastic. Two outermost terminals are respectively used to connect cables. The terminal plate serving as a back plate of the box cover is fixedly connected to the box cover in detachable manner. A cavity for filling silica gel is formed between the box cover and the terminal plate. The assembly of the solar junction box is convenient, and it has relatively good heat dissipation and sealing performance.

10 Claims, 5 Drawing Sheets

(56) References Cited

U.S. PATENT DOCUMENTS

| | | | | |
|---|---|---|---|---|
| 2012/0205149 A1* | 8/2012 | Lenel | ............... | H02S 40/34 |
| | | | | 174/547 |
| 2013/0003307 A1* | 1/2013 | Jang | ............... | H02S 40/34 |
| | | | | 361/709 |
| 2013/0016474 A1* | 1/2013 | Ger | ............... | H02S 40/345 |
| | | | | 361/707 |
| 2014/0048327 A1* | 2/2014 | Wei | ............... | H02S 40/34 |
| | | | | 174/542 |

FOREIGN PATENT DOCUMENTS

| | | |
|---|---|---|
| CN | 202034386 U | 11/2011 |
| CN | 102420266 A | 4/2012 |
| CN | 202473973 U | 10/2012 |
| CN | 102856409 A | 1/2013 |
| CN | 103022188 A | 4/2013 |
| CN | 103367499 A | 10/2013 |
| CN | 103944505 A | 7/2014 |
| CN | 204068858 U | 12/2014 |
| CN | 204168224 U | 2/2015 |
| CN | 105071764 A | 11/2015 |
| DE | 202009012176 U1 | 11/2009 |
| DE | 202012101649 U1 | 5/2012 |
| JP | 2012028407 A | 2/2012 |

\* cited by examiner

SOLAR JUNCTION BOX

CROSS REFERENCE TO RELATED APPLICATIONS

This application is the national phase entry of International Application No. PCT/CN2016/070244, filed on Jan. 6, 2016, and the entire contents of which are incorporated herein by reference.

TECHNICAL FIELD

The present invention relates to the field of photovoltaic technology, and particularly to a solar junction box for solar photovoltaic cells.

BACKGROUND

The solar junction box is a connector located between the solar cell array composed of the solar cell components and the solar charging control device, which provides users with connection schemes for the combination of solar panels. A typical solar junction box is composed of a base, a box cover and terminals between the base and the box cover, and diodes are disposed between the adjacent terminals. The diodes generate a huge amount of heat during the operation of the solar junction box. If the heat is not dissipated in time, it directly affects the performance of the solar junction box. In addition, generally, the solar junction box works in a rugged environment, so a good sealing performance is required. However, the heat dissipation and sealing performance of the existing solar junction boxes cannot meet the requirements.

SUMMARY

The technical problem to be solved by the present invention is to provide a solar junction box which is convenient in assembly and has good heat dissipation and sealing performance.

To solve the above technical problems, the present invention provides a solar junction box. The solar junction box includes a box cover and a terminal plate. The terminal plate includes a plurality of terminals arranged side by side and diode units for connecting adjacent terminals. The terminals and diode units are integrally packaged with plastic. Two outermost terminals are respectively used to connect to cables. The terminal plate serves as a back plate of the box cover and is fixedly connected to the box cover in a detachable manner. A cavity for filling silica gel is formed between the box cover and the terminal plate.

The terminal plate is fixed inside the box cover in snap-fit manner, and the back surface of the package portion of the terminal plate is a flat surface. The edges of the back of the box cover are aligned with the back surface of the package portion.

The terminal plate is fixed inside the box cover in snap-fit manner, and the back surface of the package portion of the terminal plate is configured with a traverse groove with a depth of 1.5 mm to 3.5 mm across the back of the package portion.

The edge of the package portion of the terminal plate is provided with a semi-circular notch. The box cover is provided with a semi-circular concave groove matching with the semi-circular notch in position and shape. The semi-circular notch and the semi-circular concave groove constitute a gel filling channel.

Each terminal is provided with a bus bar fixing portion extending out from the package portion. Each of the two outermost terminals is further provided with a cable compression connector extending out from the package portion of the terminal plate, and the cable is compressed into the cable compression connector for connection. The two cable compression connectors straightly extend out from the bottom of the corresponding terminal, or the two compression connectors obliquely extend out from the bottom of the corresponding terminal, and are arranged in a splayed shape. The cavity is divided into a first cavity and a second cavity, the package portion of the terminal plate is located in the first cavity, and the bus bar fixing portion is located in the second cavity. The box cover is provided with an opening connected to the second cavity, and the opening is provided with a cover plate.

The solar junction box also includes cable clamping parts. The box cover is provided with a cable groove for accommodating the cable. One end of the cable groove is connected to the cavity and the other end of the cable groove extends to the edge of the box cover. The cable clamping part is fixed in the cable groove by ultrasonic welding and is located at the edge of the box cover. The cable is clamped between the cable clamping part and the box cover. The connection point of the cable and the terminal is located in the cable groove. Silica gel is filled in the cable groove.

The cable clamping part is provided with a U-shaped groove, and the width of the U-shaped groove is matched with the outer diameter of the cable. The U-shaped groove is provided with a first arc-shaped convex portion arranged along the circumferential direction of the cable, and the first arc-shaped convex portion is provided with a first convex point. The cable groove is internally provided with a stepped surface matching with the two ends of the U-shaped groove and a second arc-shaped convex portion corresponding to the shape and position of the first arc-shaped convex portion. The second arc-shaped convex portion is provided with a second convex point. The first arc-shaped convex portion and the second arc-shaped convex portion abut against the cable, and the first convex point and the second convex point are in an interference fit with the cable. The end portions of two ends of the U-shaped groove and the edge of the cable clamping part facing toward the outside of the box cover are provided with fusing strips.

At least two first arc-shaped convex portions are arranged at intervals, wherein at least one of the two first arc-shaped convex portions is in an interference fit with the cable. At least two second arc-shaped convex portions are arranged at intervals, wherein at least one of the two second arc-shaped convex portions is in an interference fit with the cable.

Each of the two sides of the cable clamping part is provided with limit grooves set at intervals, and the cable groove is internally provided with limit blocks matched with the limit grooves for plug connection.

The diode unit includes a positive electrode chip, a negative electrode chip, and a connecting piece. The positive electrode chip is attached to one of two adjacent terminals, and the negative electrode chip is attached to the other one of the two adjacent terminals. The positive electrode chip and the negative electrode chip are connected by the connecting piece.

The solar junction box further includes the cable, and one end of the cable extending out of the box cover is provided with a connector.

In the solar junction box of the present invention, the base is replaced with a terminal plate formed by an integrated plastic package that serves as a back plate, so the heat dissipation performance is improved. The cavity is filled with silica gel, so the sealing performance is improved. Moreover, the number of parts of the junction box is reduced, the structure of the junction box is simplified, the assembly is more convenient, and the production is more efficient.

BRIEF DESCRIPTION OF THE DRAWINGS

The solar junction box according to the embodiment of the present invention will be further described below with reference to the drawings.

Figure 1:
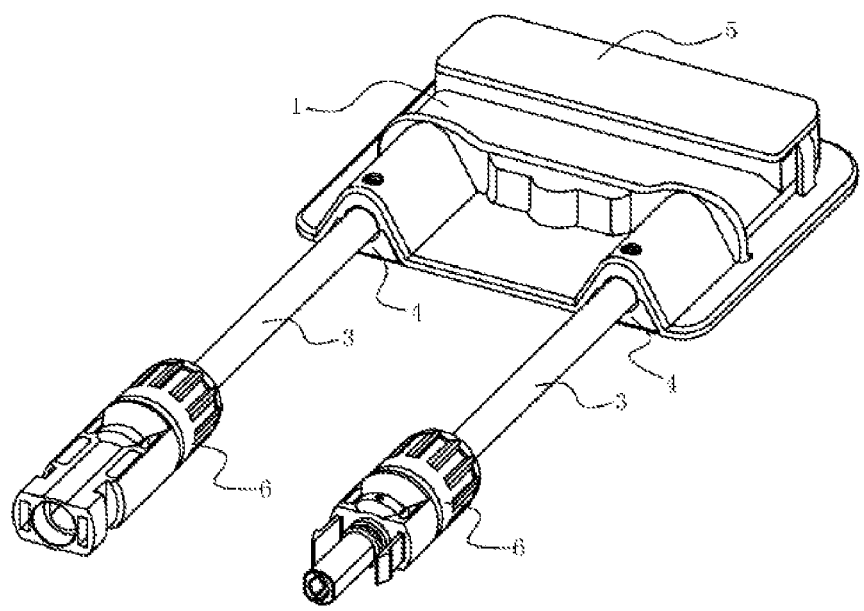
FIG. 1 is a schematic diagram showing the stereoscopic structure of the solar junction box according to the embodiments.

The reference numerals of the above drawings are as follows:

box cover 1, first cavity 11, second cavity 12, cable groove 13, stepped surface 13-1, second arc-shaped convex portion 13-2, second convex point 13-2-1, limit block 13-4, concave groove 14, opening 15,
terminal plate 2, terminal 21, bus bar fixing portion 21-1, cable compression connector 21-2, positive electrode chip 22, negative electrode chip 23, connecting piece 24, package portion 25, notch 25-1, transverse groove 25-2,
cable 3,
cable clamping part 4, U-shaped groove 41, first arc-shaped convex portion 42, first convex point 42-1, limit groove 44, fuse strip 45,
cover plate 5, connector 6.

DETAILED DESCRIPTION OF THE EMBODIMENTS

Figure 2:
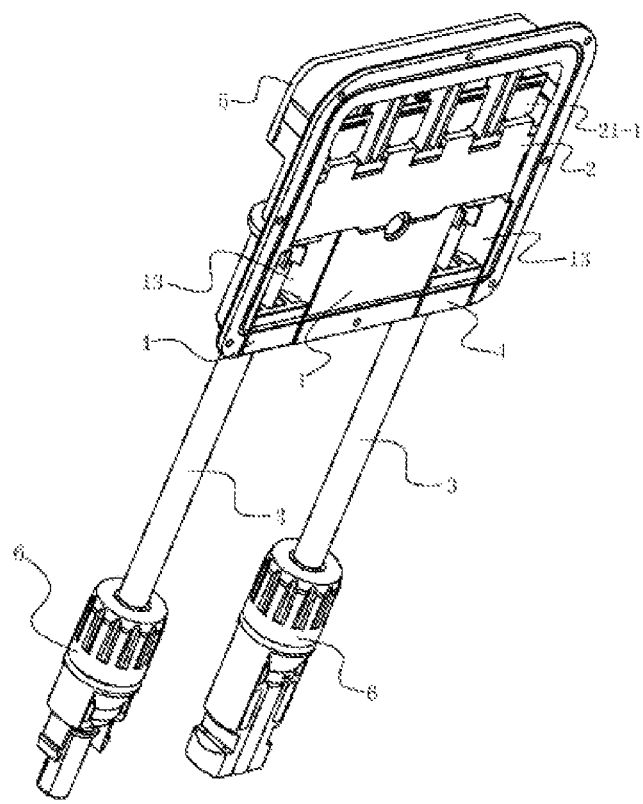
FIG. 2 is a schematic diagram showing the stereoscopic structure of the solar junction box in FIG. 1 viewing from the back.

Referring to FIG. 1 and FIG. 2, the solar junction box of the present embodiment includes a box cover 1 and a terminal plate 2. The terminal plate 2 serving as a back plate of the box cover 1 is fixed in the box cover 1 in snap-fit manner, so the assembly is more convenient. A cavity for filling silica gel is formed between the box cover 1 and the terminal plate 2. When the cavity of the box cover 1 is filled with the silica gel, the terminal plate 2 can be well sealed and protected. Cables 3 may or may not be provided, and one end of each cable 3 is compressed onto the terminal plate 2 inside the box cover 1, and the other end of each cable extends to the outside of the box cover 1 and is provided with a connector 6 for connecting to other components.

Figure 4:
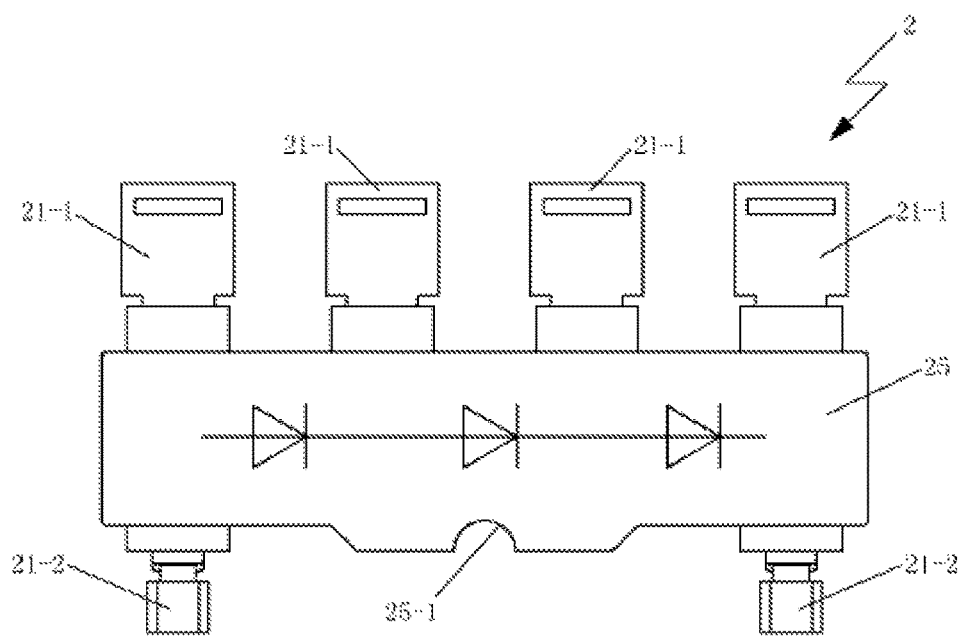
FIG. 4 is a structural schematic diagram of the terminal plate in FIG. 3 viewing from the front.
Figure 5:
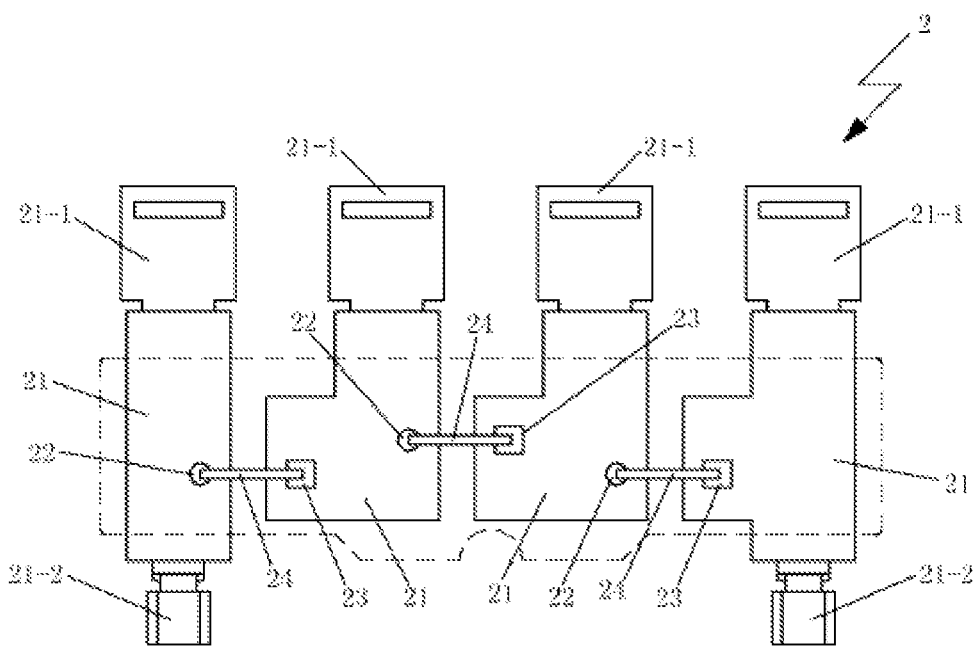
FIG. 5 is a schematic diagram showing the interior structure of the terminal plate in FIG. 4.

Referring to FIG. 4 and FIG. 5, the terminal plate 2 is integrally packaged by epoxy molding compound with four copper terminals 21 arranged side by side and three diode units for connecting adjacent terminals 21. The terminal plate 2 includes terminals 21, diode units, and package portion 25. During use, the solar junction box is connected to the solar cells via the bus bar. In order to make the connection of the terminal plates 2 with the bus bar and the cable 3 more convenient, each terminal 21 is provided with a bus bar fixing portion 21-1 extending out from the package portion 25. The two outermost terminals are also provided with cable compression connectors 21-2 extending out from the package portion 25, and the cables 3 are compressed into the cable compression connectors 21-2 for connection.

Figure 9:
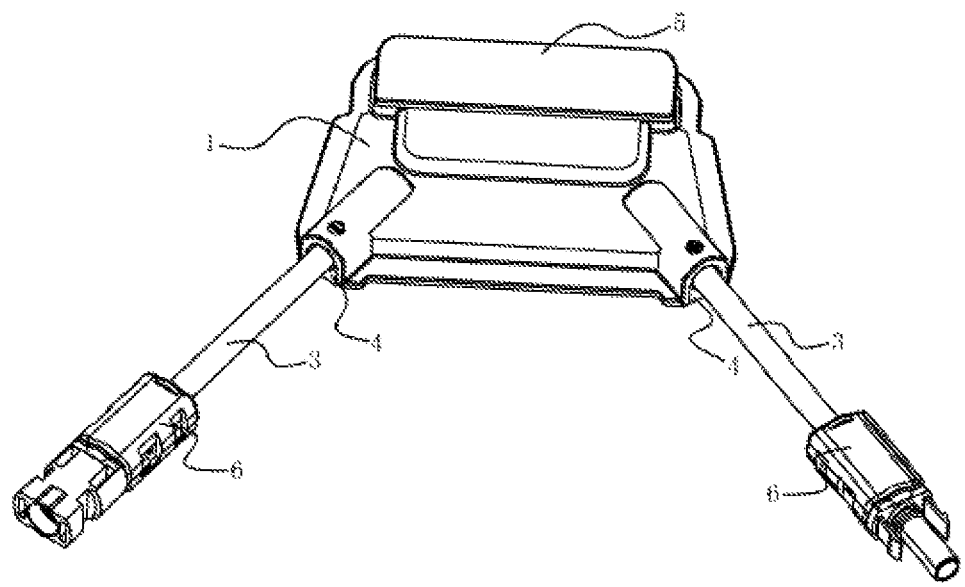
FIG. 9 is a schematic diagram showing the stereoscopic structure of the solar junction box in another form according to the embodiments.

Referring to FIG. 1 and FIG. 4, the two cable compression connectors 21-2 may straightly extend out from the bottoms of the corresponding terminals 21, so that the cables 3 also straightly extend out from the bottom of the box cover 1. Alternatively, referring to FIG. 9 and FIG. 10, the two cable compression connectors 21-2 may obliquely extend out from the bottoms of the corresponding terminals 21, and are arranged in a splayed shape, so that the cables 3 also obliquely extend out from the bottom of the box cover 1, and are arranged in a splayed shape. The cables 3 being arranged in a splayed shape can prevent the cables from damage by bending.

Referring to FIG. 5, in order to make the connection of the diode units in the terminal plate 2 more solid and less prone to damage, each diode unit includes a positive electrode chip (P-side chip of the diode) 22, a negative electrode chip (N-side chip of the diode) 23, and a connecting piece 24. The positive electrode chip 22 is attached to one of two adjacent terminals 21, and the negative electrode chip 23 is attached to the other one of the two adjacent terminals 21. The positive electrode chip 22 and the negative electrode chip 23 are connected by the connecting piece 24.

Figure 3:
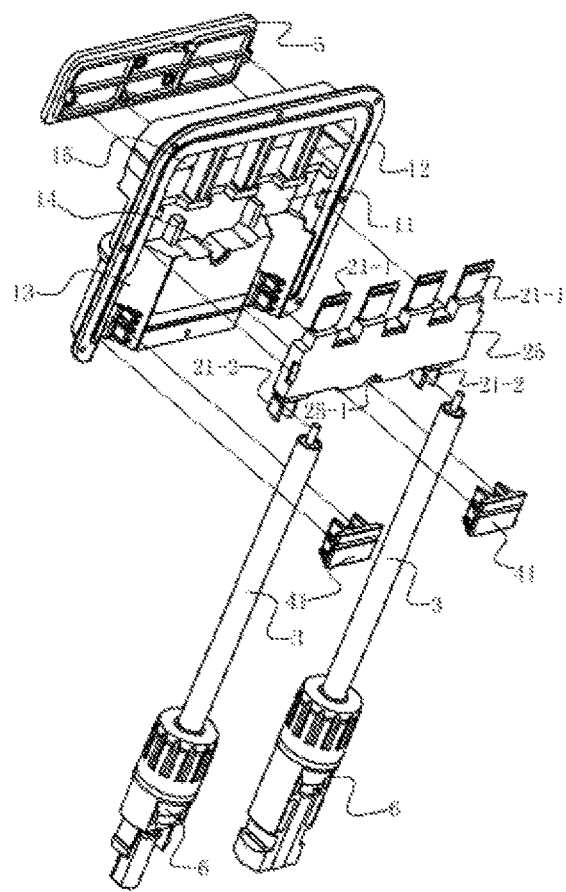
FIG. 3 is an exploded schematic diagram showing the stereoscopic structure of the solar junction box in FIG. 2.

Referring to FIG. 3, in order to make the gel filling more flexible during the production and later installation, the cavity is divided into the first cavity 11 and the second cavity 12. The package portion 25 of the terminal plate 2 is located inside the first cavity 11. The bus bar fixing portion 21-1 is located inside the second cavity 22. The box cover 1 is provided with an opening 15 connected to the second cavity 12, and the opening 15 is provided with a cover plate 5. The package portion 25 of the terminal plate 2 and the bus bar fixing portion 21-1 are respectively disposed in two mutually independent gel filling spaces. The first cavity 11 may be sealed by the gel separately in the production of the solar junction box, and then the second cavity 12 can be sealed by the gel separately in the later installation of the bus bar. By doing so, the solar junction box would have good insulation and aging resistance, good sealing effect. The power is up to 400 W, the waterproof and dustproof grade is up to IP68, and the solar junction box is durable.

Referring to FIG. 2 and FIG. 3, the back surface of the package portion 25 of the terminal plate 2 is a flat surface. The edge of the back of the box cover 1 is aligned with the back surface of the package portion 25 of the terminal plate 2, so that the back surface of the overall solar junction box is a flat surface, the back surface is smooth, and the flat back surface of the solar junction box can be better sealed or attached to the back plate of the photovoltaic module, so the sealing performance is better. Moreover, in the solar junction box, the base is replaced with a terminal plate 2 formed by an integrated plastic package as a back plate and the back plate is directly attached to the back of the box cover 1. When the solar junction box is fixed on the back plate of the photovoltaic module, the terminal plate 2 is in direct contact with the back plate of the photovoltaic module, so the heat conduction is more direct, thereby effectively improving the heat dissipation effect of the solar junction box and making the solar junction box work more stable.

Figure 10:
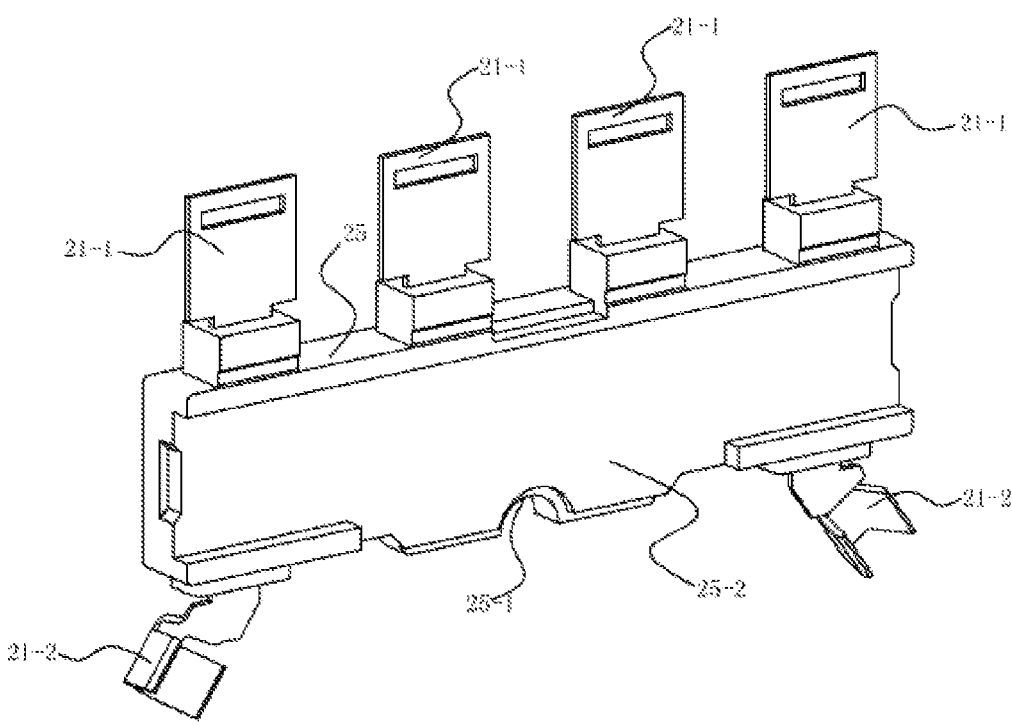
FIG. 10 is a schematic diagram showing the stereoscopic structure of the terminal plate in the solar junction box of FIG. 9.

Optionally, in order to make the back surface of the solar junction box, with huge amount of heat, not directly contact with the back plate of the photovoltaic module to prevent the photovoltaic module from being damaged by high temperature, the terminal plate 2 is fixed in the box cover in snap-fit manner, and the edge of the back of the box cover 1 is configured to be 1.5 mm to 3.5 mm higher than the back surface of the package portion of the terminal plate 2. Referring to FIG. 10, specifically, for example, the back surface of the package portion 25 is provided with a transverse groove 25-2 having a depth of 2 mm across the back surface of the package portion 25.

In order to make the gel filling of the cavity more convenient, the edge of the package portion 25 is provided with a semi-circular notch 25-1, and the box cover 1 is provided with a semi-circular groove 14 matching with the semi-circular notch 25-1 in position and shape. The semi-circular notch 14 and the semi-circular groove 25-1 constitute a gel filling channel. If a separate gel filling channel is directly provided on the terminal plate 2 or the box cover 1, the forming process of the terminal plate 2 and the box cover 1 would be inconvenient. However, by providing half gel filling channels on the terminal plate 2 and the box cover 1, respectively, not only the gel filling is more convenient, but also the formation of the terminal plate 2 and the box cover 1 is simpler, thereby ensuring the yield.

Further, referring to FIG. 2 and FIG. 3, in order to achieve better fixation and sealing effect of the cable, the solar junction box further includes cable clamping part 4, and the box cover 1 is internally provided with cable groove 13 for accommodating the cable 3. One end of the cable groove 13 is connected to the cavity, and the other end of the cable groove 13 extends to the edge of the box cover 1. For the typical solar junction box, the cable is clamped and fixed through the box cover 1 and the base which are fixed together in a snap-fit manner, and the fixation effect is modest and the sealing effect is not good. However, in the present embodiment, when the terminal plate 2 is used as the back plate of the box cover 1, the box cover 1 is provided with a cable groove 13, and the cable groove 13 is internally provided with a separate cable clamping part 4 for clamping and fixing the cable 3. Moreover, the cable groove 13 is filled with silica gel to ensure that moisture does not enter the cavity of the box cover 1 from the gap between the cable clamping part 4 and the box cover 1, thereby effectively improving the sealing performance of the solar junction box. In addition, cable groove 13 has reserved an operation space for the cable compression connector 21-2, so that the cable 3 and the terminal 21 can be compressed and connected by automatic equipment.

The box cover 1 and the cable clamping part 4 can be injection molded parts made of polyphenylene ether (PPE) material, and the cable clamping part 4 may be fixedly connected to the cable groove 13 of the box cover 1 by ultrasonic welding and located at the edge of the box cover 1. Both the box cover 1 and the cable clamping part 4 are made of polyphenylene ether (PPE) material and they are fixedly connected to each other by ultrasonic welding, so the assembly is convenient and has high connection strength, which is more favorable for improving the sealing performance and durability performance of the junction box.

Figure 6:
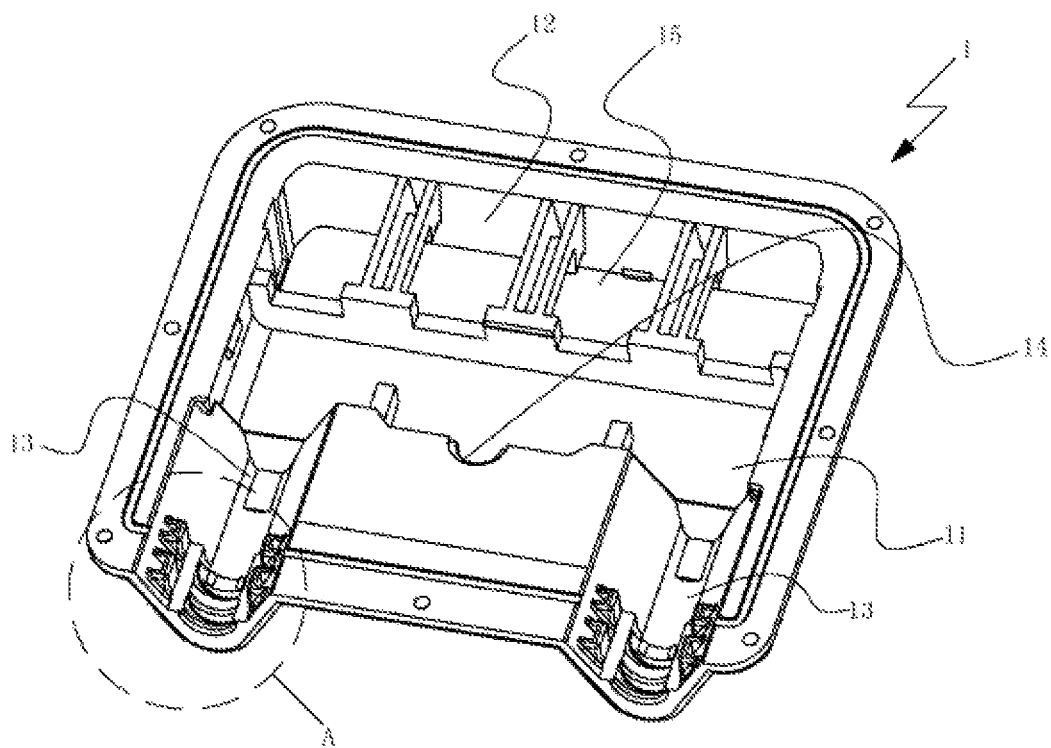
FIG. 6 is a structural schematic diagram of the box cover in FIG. 3.
Figure 8:
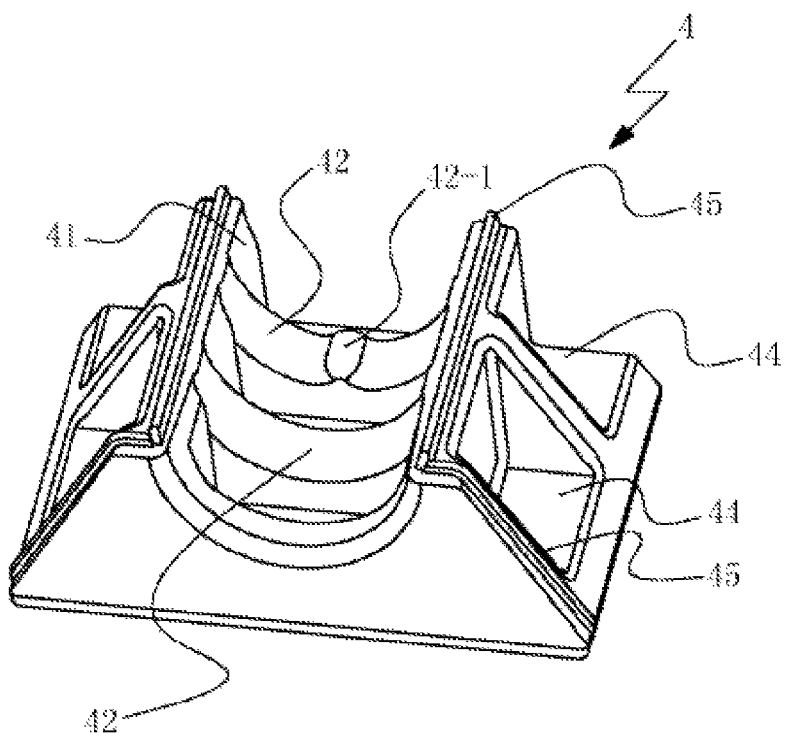
FIG. 8 is a structural schematic diagram of the cable clamping part in FIG. 3.

Referring to FIG. 6 and FIG. 8, in order to better fix the cable 3 and make the cable 3 unable to rotate, the cable clamping part 4 is provided with a U-shaped groove 41, and the width of the U-shaped groove 41 matches the outer diameter of the cable 3. The U-shaped groove 41 is internally provided with first arc-shaped convex portions 42 arranged along the circumferential direction of the cable 3. Two or more first arc-shaped convex portion 42 may be provided and they are arranged at intervals. The first arc-shaped convex portion 42 near the inside of the box cover 1 is provided with first convex point 42-1, and the first convex point 42-1 is in an interference fit with the cable 3. The first arc-shaped convex portion 42 near the outside of the box cover 1 is not provided with first convex point 42-1 and is in an interference fit with the cable 3 by itself. The cable groove 13 is internally provided with stepped surface 13-1 matching with the two ends of the U-shaped groove 41 and a second arc-shaped convex portion 13-2 corresponding to the first arc-shaped convex portion 42 in shape and position. At least two second arc-shaped convex portions 13-2 are provided and they are arranged at intervals. The second arc-shaped convex portion 13-2 near the inside of the box cover 1 is provided with second convex point 13-2-1 and the second convex point 13-2-1 is in an interference fit with the cable 3. The second arc-shaped convex portion 13-2 near the outside of the box cover 1 is not provided with the second convex point 13-2-1 and is in an interference fit with the cable 3 by itself. The first arc-shaped convex portion 42 and the second arc-shaped convex portion 13-2 abut against the cable 3. Two end portions of both ends of the U-shaped groove 41 and the edge of the cable clamping part 4 facing the outside of the box cover 1 are provided with fuse strips 45. In the ultrasonic welding, the welding head with high-frequency vibration makes the fusion strip 45 and the joint surface between the cable groove 13 and the cable clamping part 4 produce friction heat which fuses the fusion strip instantly to connect the joint surface under a moderate pressure, so the welding strength is comparable to that of the body.

The cable 3 may be limited in position through the cooperation of the U-shaped groove 41 and the cable groove 13. The convex point on the arc-shaped convex portion compresses the outer insulation layer of the cable 3 to cause a certain deformation of the insulation layer, so the cable cannot rotate under the pressure and friction. Meanwhile, the gaps on both sides of the arc-shaped convex portion also provide spaces for the deformation of the cable 3. By providing a plurality of arc-shaped convex portions, the arc-shaped convex portions provided with the convex points are in an interference fit with the cable 3 through the convex points, and the cable has a relatively large deformation. The arc-shaped convex portions without the convex points are in an interference fit with the cable 3 by themselves, and the cable 3 has relatively less deformation. Such progressive position limiting facilitates better fixation of the cable 3 and restricts the rotation of the cable 3.

Figure 7:
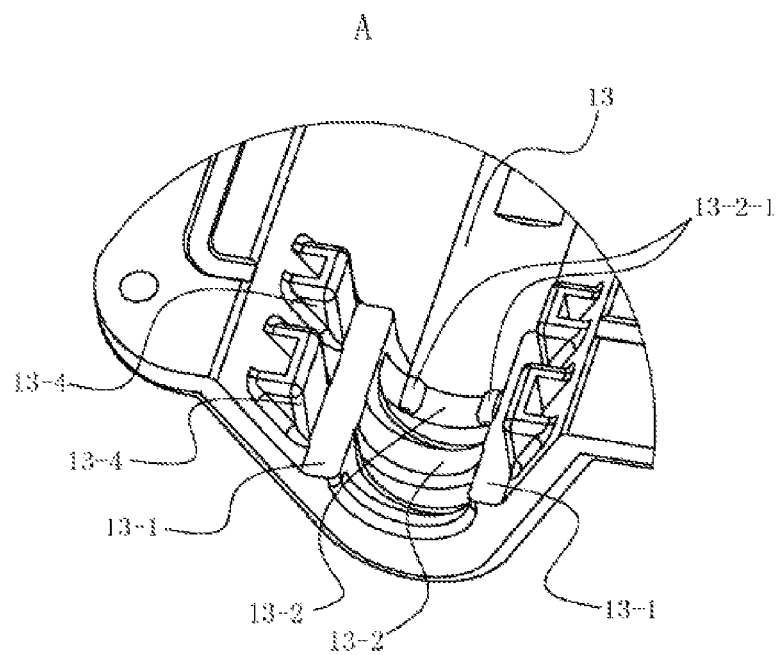
FIG. 7 is a partially enlarged schematic diagram of part A of the box cover in FIG. 6.

Referring to FIG. 6 and FIG. 7, both sides of the cable clamping part 4 are provided with limit grooves 44 set at intervals, and the cable groove 13 is internally provided with limit blocks 13-4 matching with the limit grooves 44 in a plug manner. The accuracy of the assembly can be ensured by providing limit blocks 13-4 and the limit grooves 44 that match with each other in the cable clamping part 4 and the cable groove 13. In addition, the limiting blocks 13-4 make the side surface of the cable clamping part 4 in contact with the cable groove 13 form a plurality of steps, which can improve the sealing performance of the solar junction box.

In the present embodiment, when the solar junction box is assembled, the cover plate 5 is covered on the opening 15 of the box cover 1. First, the terminal plate 2 is fixed in the box cover 1 in snap-fit manner. Then the cable 3 is compressed into the cable compression connector 21-2 for connection. After that the cable clamping part 4 is fixed in the cable groove 13 by ultrasonic welding. Next, the first cavity 11 is filled with silica gel through the gel filling channel formed by the notch 25-1 and the concave groove 14, and the cable groove 13 is filled with silica gel. By doing this, the junction box becomes a semi-finished product. After the semi-finished product is supplied to a customer, the customer opens the cover plate 5 and fixedly connects the bus bar to the bus bar fixing portion 21-1, and then the second cavity 12 is filled with silica gel through the opening 15, and the edge of the back of the box cover 1 is attached to the back plate of the photovoltaic module.

In the solar junction box of the present embodiment, the base is replaced with a terminal plate 2 formed by an integrated plastic package to serve as a back plate. The solar junction box is composed of the terminal plate 2 and the box cover 1 after gel filling. The package portion 25 of the terminal plate 2 has good thermal conductivity and the heat generated by the terminal plate 2 is transmitted to the box cover 1 through the silica gel, so the heat dissipation of the diode changes from point dissipation to surface dissipation and the heat dissipation is more uniform and direct. Such modular design reduces the number of parts in the junction box and simplifies the construction of the junction box, thereby making the assembly easier and the production more efficient.

Obviously, the above embodiments are merely examples given for a clear illustration of the implementations of the present invention, and are not intended to limit the scope of the present invention. Other variations or modifications in various forms may be derived by those skilled in the art in light of the above description. It is unnecessary to list all of the implementations. Obvious changes or variations that are derived from the spirit of the invention should be considered as falling within the scope of the present invention.

The invention claimed is:

1. A solar junction box, comprising: a box cover and a terminal plate;
   wherein the terminal plate includes a plurality of terminals arranged side by side and a plurality of diode units for connecting adjacent terminals, the plurality of terminals and the plurality of diode units are integrally packaged with plastic, and two outermost terminals are respectively used to connect to cables;
   the terminal plate serving as a back plate of the box cover is fixedly connected to the box cover in a detachable manner; and
   a cavity for filling silica gel is formed between the box cover and the terminal plate;
   wherein an edge of a package portion of the terminal plate is provided with a semi-circular notch; the box cover is provided with a semi-circular concave groove matching with a position and a shape of the semi-circular notch; and the semi-circular notch and the semi-circular groove constitute a gel filling channel.

2. The solar junction box according to claim 1, wherein the terminal plate is fixed in the box cover in a snap-fit manner; a back surface of a package portion of the terminal plate is a flat surface; and an edge of the back of the box cover is aligned with the back surface of the package portion.

3. The solar junction box according to claim 1, wherein the terminal plate is fixed in the box cover in the snap-fit manner; a back surface of a package portion of the terminal plate is configured with a transverse groove with a depth of 1.5 mm to 3.5 mm across the back of the package portion.

4. The solar junction box according to claim 1, wherein each of the plurality of terminals is provided with a bus bar fixing portion extending out from the package portion of the terminal plate;
   each of the two outermost terminals is further provided with a cable compression connector extending out from the package portion; the cable is compressed into the cable compression connector for a connection;
   the cable compression connectors straightly extend out from the bottom of the corresponding terminal; or the compression connectors obliquely extend out from the bottom of the corresponding terminal, and are arranged in a splayed shape;
   the cavity is divided into a first cavity and a second cavity; the package portion of the terminal plate is located in the first cavity; the bus bar fixing portion is located in the second cavity;
   the box cover is provided with an opening connected to the second cavity; and the opening is provided with a cover plate,
   wherein an edge of a package portion of the terminal plate is provided with a semi-circular notch; the box cover is provided with a semi-circular concave groove matching with a position and a shape of the semi-circular notch; and the semi-circular notch and the semi-circular groove constitute a gel filling channel.

5. The solar junction box according to claim 1, further comprising a cable clamping part, wherein
   the box cover is internally provided with a cable groove for accommodating a cable; a first end of the cable groove is connected to the cavity and a second end of the cable groove extends to an edge of the box cover; the cable clamping part is fixed in the cable groove by ultrasonic welding and is located at the edge of the box cover;
   the cable is clamped between the cable clamping part and the box cover;
   a connection point of the cable and each terminal is located in the cable groove; and silica gel is filled in the cable groove.

6. The solar junction box according to claim 5, wherein the cable clamping parts are provided with a U-shaped groove; a width of the U-shaped groove is matched with an outer diameter of the cable; the U-shaped groove is internally provided with a first arc-shaped convex portion arranged along a circumferential direction of the cable; the first arc-shaped convex portion is provided with a first convex point;
   the cable groove is internally provided with stepped surfaces matching with two ends of the U-shaped groove and a second arc-shaped convex portion corresponding to a shape and a position of the first arc-shaped convex portion; the second arc-shaped convex portion is provided with a second convex point;
   the first arc-shaped convex portion and the second arc-shaped convex portion abut against the cable; the first convex point and the second convex point are in an interference fit with the cable;

end portions of two ends of the U-shaped groove and an edge of the cable clamping part facing toward the outside of the box cover are provided with fuse strips.

7. The solar junction box according to claim 6, wherein at least two first arc-shaped convex portions are arranged at intervals, wherein at least one of the two first arc-shaped convex portions is in an interference fit with the cable;

at least two second arc-shaped convex portions are arranged at intervals, wherein at least one of the two second arc-shaped convex portions is in an interference fit with the cable.

8. The solar junction box according to claim 1, wherein both sides of the cable clamping part are provided with limit grooves set at intervals; and the cable groove is internally provided with limit blocks matched with the limit grooves for a plug connection.

9. The solar junction box according to claim 1, wherein the diode unit comprises a positive electrode chip, a negative electrode chip, and a connecting piece; the positive electrode chip is attached to a first one of two adjacent terminals; the negative electrode chip is attached to a second one of the two adjacent terminals; and the positive electrode chip and the negative electrode chip are connected by the connecting piece.

10. The solar junction box according to claim 1, further comprising a cable, wherein an end of the cable extending out of the box cover is provided with a connector.

* * * * *